(12) United States Patent
Lian

(10) Patent No.: US 6,984,555 B2
(45) Date of Patent: Jan. 10, 2006

(54) DEVICE AND METHOD FOR INHIBITING OXIDATION OF CONTACT PLUGS IN FERROELECTRIC CAPACITOR DEVICES

(75) Inventor: Jingyu Lian, Wallkill, NY (US)

(73) Assignee: Infineon Technologies AG, Munich ( * ) Notice: Subject to any disclaimer, the term of this patent is extended or adjusted under 35 U.S.C. 154(b) by 0 days.

(21) Appl. No.: 10/702,074

(22) Filed: Nov. 3, 2003

(65) Prior Publication Data

US 2005/0093040 A1 May 5, 2005

(51) Int. Cl.
H01L 21/8242 (2006.01)

(52) U.S. Cl. .......... 438/240; 438/396; 438/672
(58) Field of Classification Search ........ 438/240, 438/396, 672, FOR 220, FOR 430
See application file for complete search history.

(56) References Cited

U.S. PATENT DOCUMENTS

| | | | | |
|---|---|---|---|---|
| 5,597,756 A | * | 1/1997 | Fazan et al. | ........ 438/398 |
| 5,742,472 A | * | 4/1998 | Lee et al. | ........ 361/321.4 |
| 5,793,076 A | * | 8/1998 | Fazan et al. | ........ 257/298 |
| 5,990,507 A | | 11/1999 | Mochizuki et al. | |
| 6,165,804 A | | 12/2000 | Fazan et al. | |
| 6,175,127 B1 | * | 1/2001 | Hong | ........ 257/295 |
| 6,235,573 B1 | * | 5/2001 | Lee et al. | ........ 438/241 |
| 6,351,005 B1 | | 2/2002 | Al-Shareef et al. | |
| 2002/0003249 A1 | | 1/2002 | Park | |
| 2002/0055191 A1 | * | 5/2002 | Matsushita et al. | ........ 438/3 |
| 2003/0094639 A1 | | 5/2003 | Ozaki | |
| 2003/0129796 A1 | | 7/2003 | Bruchhaus et al. | |
| 2004/0166629 A1 | * | 8/2004 | Hilliger et al. | ........ 438/253 |

FOREIGN PATENT DOCUMENTS

| | | |
|---|---|---|
| DE | 101 31 626 | 1/2003 |
| JP | 2001060670 A * | 3/2001 |

* cited by examiner

Primary Examiner—George Fourson
Assistant Examiner—Michelle Estrada
(74) Attorney, Agent, or Firm—Fish & Richardson P.C.

(57) ABSTRACT

A ferroelectric capacitor device and method for producing such a device comprises forming a substrate, and forming a contact plug passing through the substrate. An electrically insulating layer is formed on the substrate, and a first electrode is formed on the electrically insulating layer. A ferroelectric layer is formed on the first electrode and a second electrode is formed on the ferroelectric layer. The first electrode is then electrically connected to the plug through the electrically insulating layer.

21 Claims, 5 Drawing Sheets

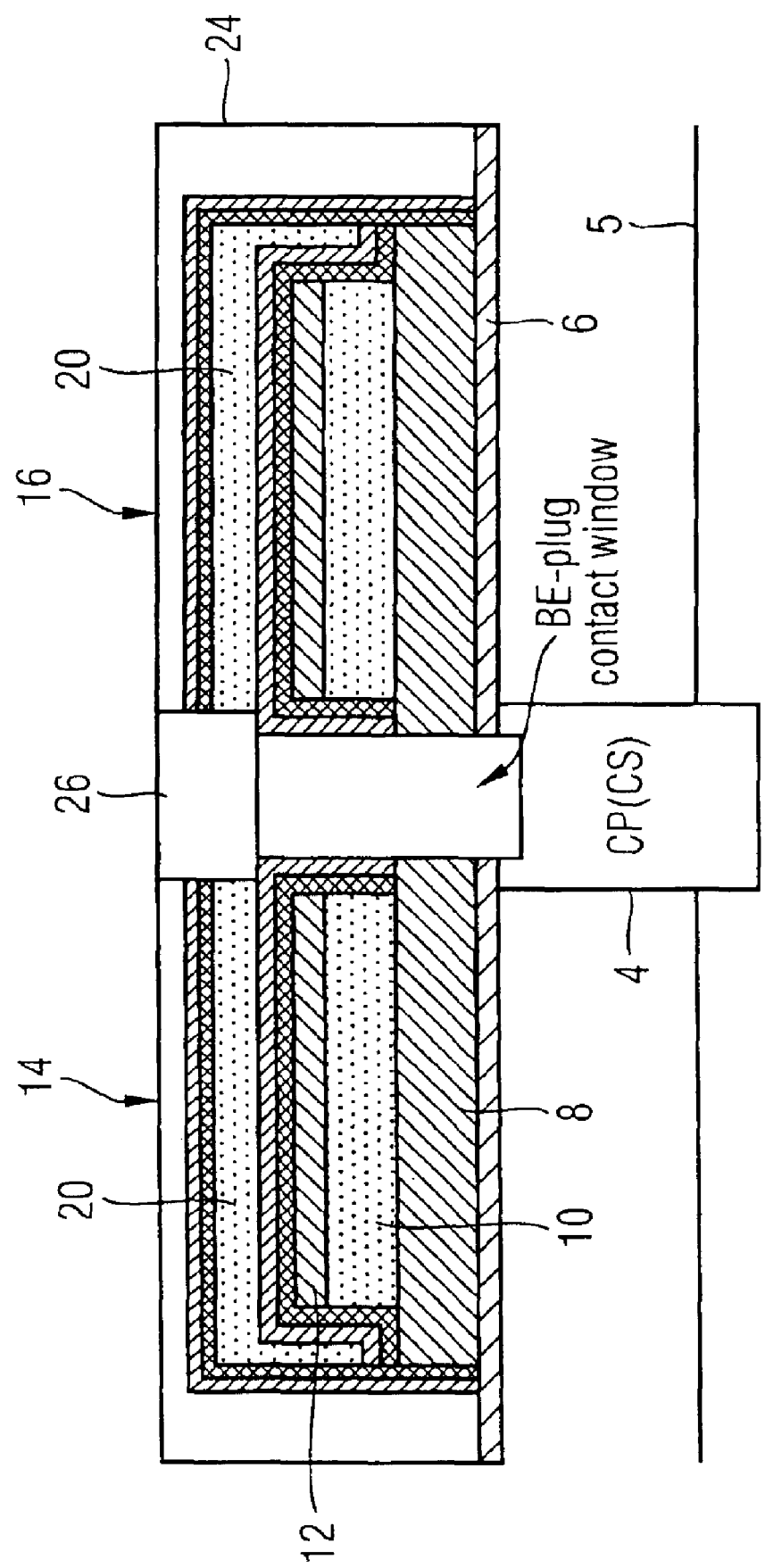

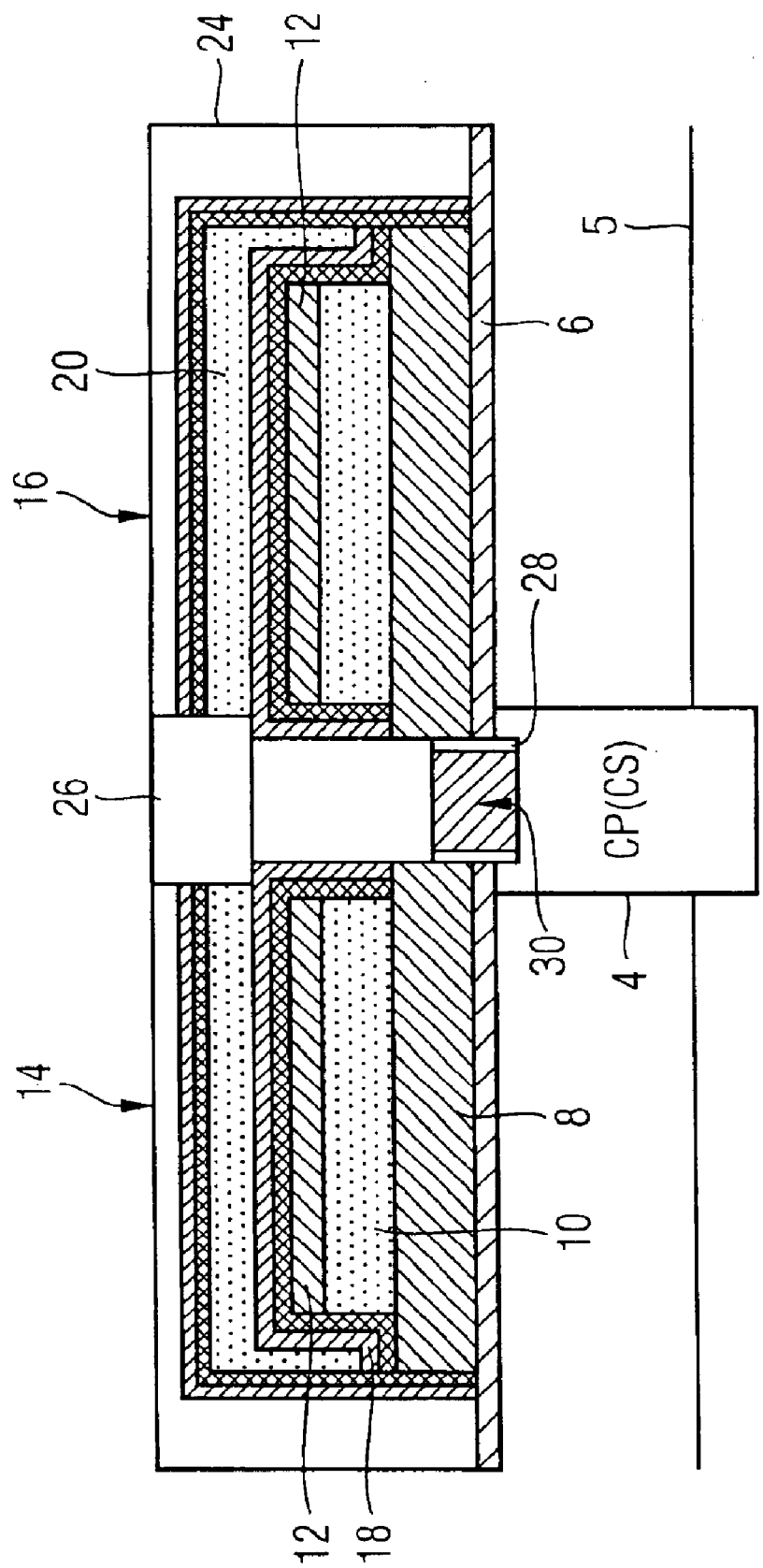

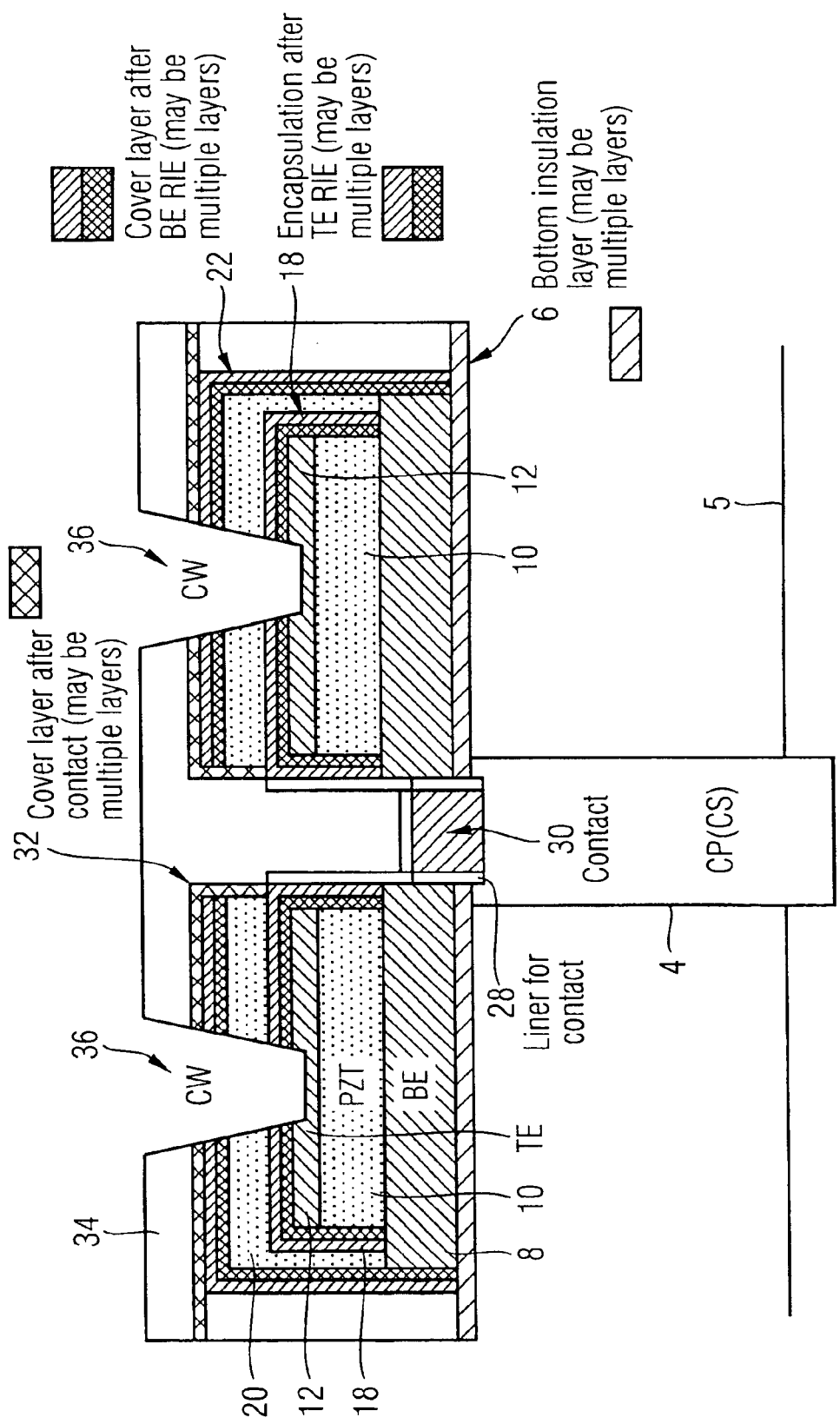

DEVICE AND METHOD FOR INHIBITING OXIDATION OF CONTACT PLUGS IN FERROELECTRIC CAPACITOR DEVICES

FIELD OF THE INVENTION

The present invention relates to methods and systems for inhibiting oxidation of contact plugs in, for example, ferroelectric capacitor devices.

BACKGROUND OF THE INVENTION

In conventional capacitor on plug (COP) devices, contact plugs are often used as vertical interconnects between metal lines in multilevel interconnect schemes. During processing of a contact window (CW) hole opening using an oxide reactive ion etch (RIE), oxygen forms in the Tetraethyl Orthosilicate (TEOS) hardmask covering the capacitor. An iridium (Ir) based barrier is often positioned between a bottom electrode (BE) and the TEOS substrate to block oxygen from causing damage when it diffuses to the plug. However, TEOS residues of the etching process ("fences") can form during RIE processing of the bottom electrode. These fences allow the oxygen to diffuse from the TEOS hardmask to the plugs during the contact window hole RIE processing. This oxygen reacts with the material of the plug, for example poly silicon or Tungsten, causing functional damage to the plug structure, in particular causing contact degradation.

One way to avoid this plug oxidisation problem is to make the bottom electrode RIE process such that no oxygen-diffusion-allowing fences are formed. However, this is difficult to achieve in typical processes where the hardmask covering the bottom electrode during bottom electrode RIE processing has a steep taper angle.

Another way to avoid the plug oxidization problem is to remove the TEOS fences after they were formed. However, this is a difficult and complex process.

In view of the foregoing problems with conventional processes and devices, a need exists for a method for inhibiting oxidation of the plug during the manufacture of a capacitor.

SUMMARY OF THE INVENTION

In general terms, the present invention proposes a method of fabricating a device, such as a ferroelectric capacitor, in which the contact to the plug is formed after formation of the device. This is considered particularly advantageous as damage to the plug from oxidation during processing may thereby be avoided or reduced. Also, in view of this, there is no need for the inclusion of a thick single or multiple layer oxygen barrier between the substrate and the bottom electrode. In general terms, the present invention also proposes that an electrically insulating layer be located between the substrate and the bottom electrode which is sufficiently resistant to oxygen diffusion to protect the plug. As this layer is electrically insulating, subsequently a hole is opened through the layer, and electrical contact is made through the hole between the bottom electrode and the plug. The insulating layer blocks at least some of the oxygen diffusion paths around the sides of the bottom electrode.

According to a first aspect of the present invention there is provided a method for fabricating a device comprising the steps of:
forming a substrate;
forming a contact plug through said substrate;
forming an electrically insulating layer on said substrate;
forming a first electrode on said insulation layer;
forming a dielectric layer on said first electrode;
forming a second electrode on said dielectric layer; and
electrically connecting said first electrode to said plug through said electrically insulating layer.

According to a second aspect of the present invention there is provided a device formed according to the above-defined method.

According to a third aspect of the present invention there is provided a ferroelectric capacitor device according to the above-defined method.

According to a fourth aspect of the present invention there is provided a Random Access Memory device comprising one or more devices formed according to the above-defined method.

According to a fifth aspect of the present invention there is provided a device comprising:
a substrate;
a contact plug passing through said substrate;
an electrically insulating layer formed on said substrate;
a first electrode formed on said first insulating layer, said first electrode being electrically connected to said plug through said electrically insulating layer;
a dielectric layer formed on said first electrode; and
a second electrode formed on said dielectric layer.

BRIEF DESCRIPTION OF THE FIGURES

Preferred features of the invention will now be described, for the sake of illustration only, with reference to the following Figures in which:

FIG. 2a is a schematic cross-sectional view of a capacitor in a first stage of making contact with a bottom electrode according to an embodiment of the present invention;

FIG. 2b is a schematic cross-sectional view of a capacitor in a second stage of making contact with a bottom electrode according to an embodiment of the present invention; and FIG. 3 is a schematic cross-sectional view of a capacitor in a final stage of manufacture according to an embodiment of the present invention showing the encapsulant and cover.

DETAILED DESCRIPTION OF PREFERRED EMBODIMENTS

Conventional ferroelectric capacitors consist of a ferroelectric layer of material such as PZT, with electrodes above and below this layer. Various hardmask layers such as TEOS are used during the patterning of the electrodes. Encapsulation layers and cover layers are added to protect the resultant capacitor.

The drawings show the various processing stages of a device such as a ferroelectric capacitor, according to a preferred embodiment of the present invention, resulting in the processed device of FIG. 3.

Figure 1A:
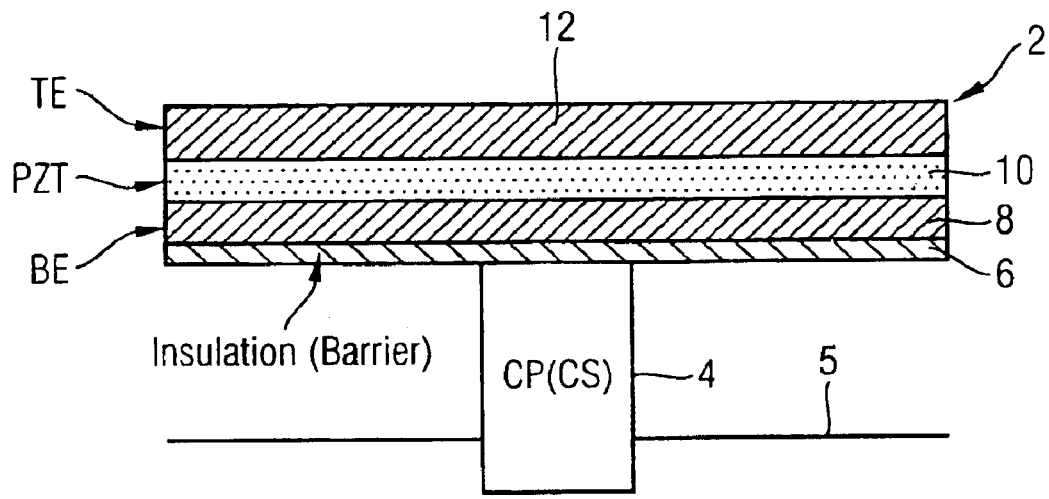
FIG. 1a is a schematic cross-sectional view of a capacitor in a first stage of formation according to an embodiment of the present invention.

FIG. 1a shows the first stage in the production process of a device 2 for inhibiting oxidation of the plug 4, in which the plug 4 is formed through a substrate 5. A layer 6 of electrically insulating material is deposited on the surface of the substrate 5 over which is deposited bottom electrode material 8. The next layer applied is dielectric layer 10, such as a layer of ferroelectric material, for example PZT, over which is deposited the top electrode 12. The insulating layer 6 is preferably resistant to oxygen diffusion to prevent oxygen from penetrating into the substrate 5.

Figure 1B:
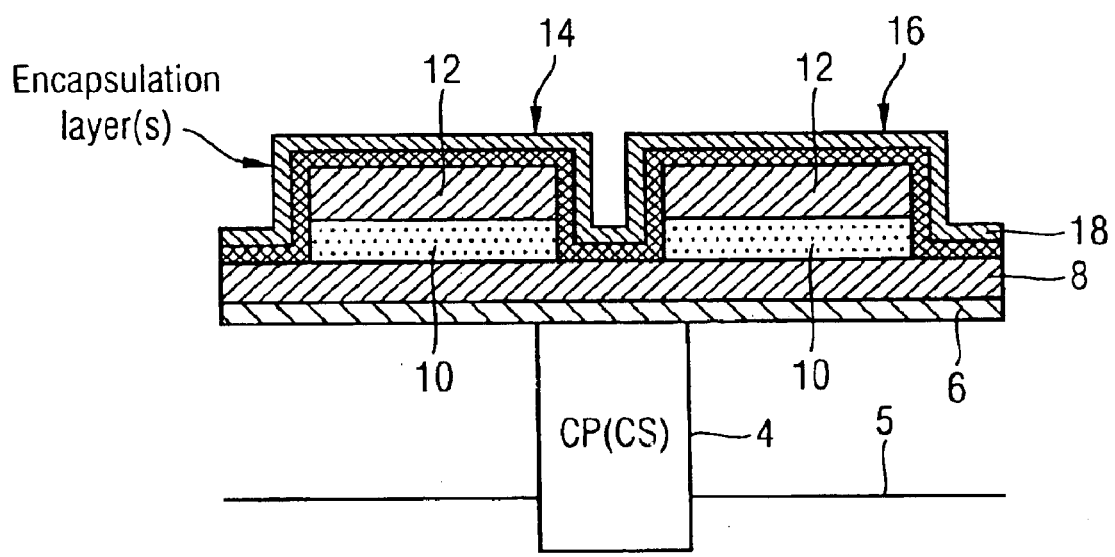
FIG. 1b is a schematic cross-sectional view of a capacitor in a second stage of formation according to an embodiment of the present invention.

FIG. 1b shows the next stage in the production process which involves an RIE (reactive ion etch) of the top electrode 12 and the layer of ferroelectric material 10 according, for example to a hardmask (not shown) which may be applied as a layer to the top electrode 12. The RIE process serves also to divide the material into separate capacitors 14, 16, having a common bottom electrode 8. A number of layers 18, for example two layers, of encapsulation are then applied for protection.

Figure 1C:
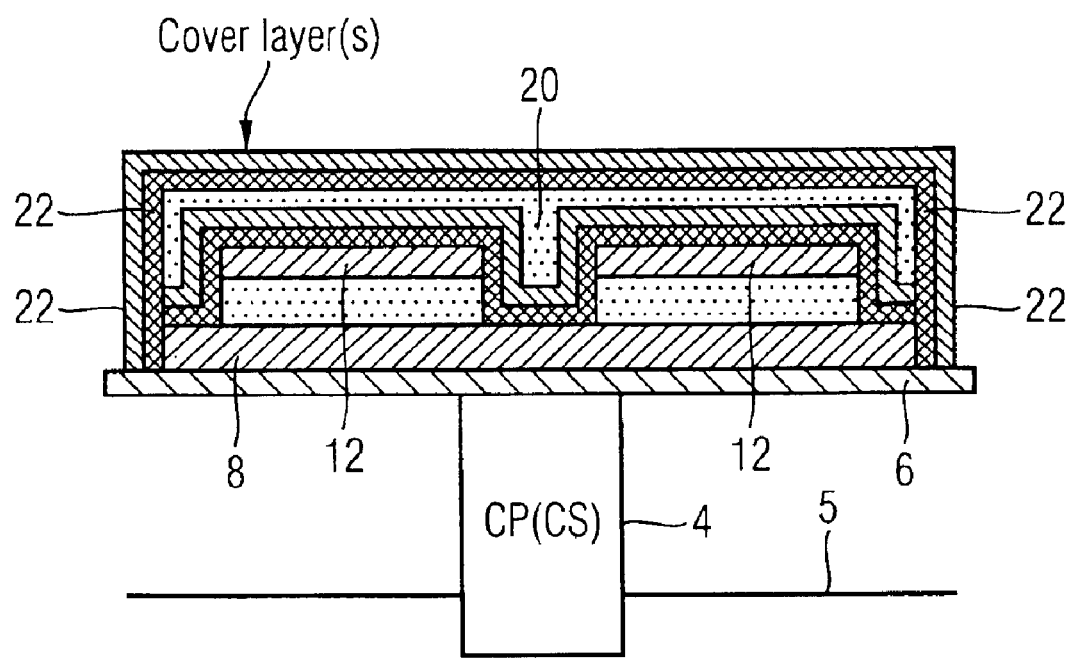
FIG. 1c is a schematic cross-sectional view of a capacitor in a third stage of formation according to an embodiment of the present invention.

FIG. 1c shows a further stage in the production process in which a hardmask 20 is applied to the bottom electrode 8 over the encapsulation layers 18. The bottom electrode 8 is then etched according to the hardmask 20 and a number of cover layers 22, for example two layers, are deposited over the capacitors 14, 16.

FIG. 2a shows a first stage in forming contact between the bottom electrode 8 and the plug 4 which involves depositing an interlayer dielectric 24, planarising the interlayer dielectric 24, and opening a contact window 26 extending from the top of the interlayer dielectric 24 to the plug 4, between the separate capacitors 14, 16.

FIG. 2b shows the final stage of making the contact between the plug 4 and the bottom electrode 8, in which a contact liner 28 is deposited in the contact window 26 to coat the peripheral walls defining the contact window 26. The contact window 26 is then filled with a contact metal 30 to form a contact between the bottom electrode 8 and the plug 4. The contact metal 30 inserted in the contact window 26 and the liner 28 are then etched back to leave just the metal contact between the bottom electrode 8 and the plug 4.

FIG. 3 shows the final stage in the production of the device 2. The first step is to deposit a further cover layer 32 over the individual capacitors 14, 16 extending from the insulating layer 6 deposited on the surface of the substrate 5 to the first cover layer 32 covering the top electrode 12. A further interlayer dielectric layer 34 is then deposited over the further cover layer 32. The further interlayer dielectric layer 34 is then planarised, for example by chemical metal polishing (CMP). A contact window 36 for each capacitor 14, 16 is formed through the further interlayer dielectric 34, the cover layers 32 and 22, the hardmask 20, the encapsulation layers 18 and into the top electrodes 12.

From the above description, it will be seen that the plug 4 connected to the bottom electrode 8 is protected during the RIE process. When the contact windows 36 are formed which extend to the top electrodes 12, the contact to the plug 4 from the bottom electrode 8 is protected by the cover layer 32 and the interlayer dielectric 34 so that oxygen cannot damage the plug 4. When the bottom electrode 8 is etched, there are one or more encapsulation layers 18 over the capacitors 14, 16 which serve to protect the plug 4 further from oxidization. Also, when the contact windows 36 to the top electrodes 12 are formed, the bottom electrode 8 and its contact are covered by an interlayer dielectric layer, further protecting the plug 4 from oxidization (oxidation).

The systems and methods according to the present invention may be particularly useful in the production of devices for use, for example, as ferroelectric random access memories. It will be noted that the terms oxidation and oxidization have been used interchangeably in the specification.

Various modification to the embodiments of the present invention described above may be made. For example, other materials and method steps can be added or substituted for those above. Thus, although the invention has been described above using particular embodiments, many variations are possible within the scope of the claims, as will be clear to the skilled reader, without departing from the spirit and scope of the invention.

What is claimed is:

1. A method for fabricating a device comprising the steps of:
    forming a substrate;
    forming a contact plug through said substrate;
    forming an electrically insulating layer on said substrate;
    forming a first electrode on said electrically insulating layer;
    forming a dielectric layer on said first electrode;
    forming a second electrode on said dielectric layer;
    and then electrically connecting said first electrode to said plug through said electrically insulating layer.

2. The method of claim 1, wherein the step of forming an electrically insulating layer comprises forming an electrically insulating layer resistant to oxygen diffusion.

3. The method of claim 1, further comprising the step of etching said second electrode and said dielectric layer to divide the device into a number of devices having a common first electrode prior to electrically connecting said first electrode to said plug.

4. The method of claim 3, further comprising the step of forming one or more encapsulation layers on said second electrode and dielectric layer after the step of etching said second electrode and said dielectric layer.

5. The method of claim 4, further comprising the step of forming a hardmask over said one or more encapsulation layers to define said first electrode.

6. The method of claim 5, further comprising the step of etching said first electrode according to said hardmask after the step of forming said hardmask.

7. The method of claim 6, further comprising the step of forming one or more cover layers over said hardmask after the step of etching said first electrode, said one or more cover layers extending to said electrically insulating layer.

8. The method of claim 6, further comprising the step of forming an interlayer dielectric layer on said one or more cover layers.

9. The method of claim 8, further comprising the step of planarising said interlayer dielectric layer.

10. The method in claim 9, further comprising the step of forming a contact window to said first electrode after the step of planarizing said interlayer dielectric layer.

11. The method of claim 10, further comprising the step of depositing a contact liner in said contact window.

12. The method of claim 11, further comprising the step of depositing in said contact window a metal insert after the step of depositing said contact liner in said contact window, to establish electrical contact between said first electrode and said plug.

13. The method of claim 12, further comprising the step of etching said contact liner and said metal insert from said interlayer dielectric to said first electrode.

14. The method of claim 13, further comprising the step of depositing a further cover layer to line said contact window and surface of said metal insert after the step of etching said contact liner and said metal insert.

15. The method of claim 14, further comprising the steps of applying a further interlayer dielectric layer over said further cover layer after the step of depositing said further cover layer.

16. The method of claim 15, further comprising the step of planarizing said further interlayer dielectric layer.

17. The method of claim 16, further comprising the step of forming one or more contact windows to second electrode after the step of planarizing said further interlayer dielectric layer.

18. The method according to claim 1, wherein the step of forming a dielectric layer on said first electrode comprises forming a ferroelectric layer on said first electrode.

19. A device formed according to the method of claim 1.

20. A ferroelectric capacitor device formed according to the method of claim 1.

21. A Random Access Memory device comprising one or more devices formed according to the method of claim 1.

\* \* \* \* \*